United States Patent
Furihata et al.

(10) Patent No.: US 6,242,151 B1
(45) Date of Patent: Jun. 5, 2001

(54) POLYMERS, RESIST COMPOSITIONS AND PATTERNING METHOD

(75) Inventors: Tomoyoshi Furihata; Hideto Kato, both of Usui-gun; Satoshi Okazaki, Nakakubiki-gun, all of (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/372,035

(22) Filed: Aug. 11, 1999

(30) Foreign Application Priority Data

Aug. 12, 1998 (JP) .................................. 10-241129

(51) Int. Cl.⁷ .............................. G03F 7/023; G03F 7/30
(52) U.S. Cl. .................. 430/190; 430/192; 430/193; 430/326; 430/330; 528/148; 528/150
(58) Field of Search ...................... 430/190, 192, 430/193, 326, 330; 528/148, 150

(56) References Cited

U.S. PATENT DOCUMENTS

| | | | |
|---|---|---|---|
| 4,681,923 | * | 7/1987 | Demmer et al. ...................... 525/504 |
| 5,422,221 | * | 6/1995 | Okazaki et al. ...................... 430/190 |
| 5,447,825 | * | 9/1995 | Nishi et al. ........................... 430/326 |
| 5,837,417 | * | 11/1998 | Rahman et al. ...................... 430/169 |
| 5,932,396 | * | 8/1999 | Kamijima et al. ................... 430/190 |

FOREIGN PATENT DOCUMENTS 0211667    2/1987   (EP) .

OTHER PUBLICATIONS

SPIE, vol. 1466, pp. 161–173 (1991).
Nikkei Microdevice, pp. 44–46 (1992).

* cited by examiner

*Primary Examiner*—John S. Chu
(74) *Attorney, Agent, or Firm*—Millen White Zelano & Branigan

(57) ABSTRACT

The invention provides a novel polymer in the form of a novolac resin in which some of the hydrogen atoms of the hydroxyl groups are replaced by 1,2-naphthoquinonediazidosulfonyl ester groups and some of the hydrogen atoms of the remaining hydroxyl groups are replaced by substituted carbonyl or sulfonyl groups. The polymer has a weight average molecular weight calculated as polystyrene of 1,000–30,000. The polymer is formulated into a resist composition having improved uniformity, sensitivity, resolution and pattern geometry in microfabrication.

9 Claims, No Drawings

POLYMERS, RESIST COMPOSITIONS AND PATTERNING METHOD

This invention relates to a novel polymer in the form of a novolac resin in which some of the hydrogen atoms of hydroxyl groups are replaced by specific groups, a resist composition comprising the polymer, and a patterning method.

BACKGROUND OF THE INVENTION

Prior art novolac resist materials generally use a novolac resin and a photosensitive agent as two main components. Numerous studies have been made on the novolac resin, photosensitive agent and solvent in order to develop a resist material which is improved in sensitivity, resolution, pattern geometry, heat resistance, film retention, adhesion-to-substrate, and shelf stability, and which can accommodate the wavelength of a light source in various steppers.

With respect to the novolac resin, for example, resist characteristics are largely affected by molecular weight fractions of a novolac resin. For example, a tandem type novolac resin consisting of a low molecular weight fraction (Mw=150 to 500) and a high molecular weight fraction (Mw>5,000), with a middle molecular weight fraction (MW=500 to 5,000) excluded, provides a resist composition having a good balance of sensitivity, resolution and heat resistance (see T. Kajita et al., Proc. SPIE, 1446, 161 (1991)).

With respect to the photosensitive agent, research works comply with the change of the stepper light source from g-line to i-line. Since resist compositions comprising conventional benzophenone photosensitive agents have a low transmittance, it was proposed to use non-benzophenone photosensitive agents having less absorption of i-line (see Nikkei Microdevice, April 1992, page 45).

Research works have also been made on the solvent. A resist composition is typically prepared using a conventional cellosolve solvent such as ethyl cellosolve acetate. When it is allowed to stand, even after filtration through a filter with a pore size of 0.2 μm, very fine microparticulates which are not visible to the naked eyes can form in the resist composition. Some microparticulates have a size of more than 0.5 μm. If a resist pattern of about 1 μm is formed on a wafer using the resist composition containing such relatively large microparticulates, the microparticulates are left on the pattern, leading to a lower resolution and exacerbating the manufacture yield of integrated circuits. In this regard, it is proposed in JP-B 3-22619, for example, to formulate a resist composition having improved long-term storage stability by dissolving an alkali-soluble resin and a 1,2-quinonediazide compound in a monooxycarboxylate-containing solvent.

These approaches dealing with the novolac resin and photosensitive agent have drawbacks. In order to realize a high resolution resist composition of good performance by combining the above measures, many additional steps are needed for the resist composition-formulating process, adding to the cost. The approach focusing at the solvent also has drawbacks. Insofar as a 1,2-quinonediazide compound monomer is used as the photosensitive agent in a resist composition as described above, the monomer will precipitate after filtration, detracting from the long-term shelf stability of the resist composition. A further improvement is thus desired.

SUMMARY OF THE INVENTION

An object of the invention is to provide a novel and improved polymer which is formulated into a resist composition having improved uniformity, sensitivity, resolution and pattern geometry as well as improved heat resistance, film retention, substrate adhesion and storage stability. Another object is to provide a resist composition comprising the polymer. A further object is to provide a patterning method using the resist composition.

The inventors have found a novel polymer in the form of a novolac resin in which some of the hydrogen atoms of the hydroxyl groups are replaced by 1,2-naphthoquinonediazidosulfonyl ester groups and some of the hydrogen atoms of the remaining hydroxyl groups are replaced by substituted carbonyl or sulfonyl groups. This polymer is formulated into a resist composition which has improved uniformity, sensitivity, resolution and pattern geometry in microfabrication as well as improved heat resistance, film retention, substrate adhesion and storage stability.

In a first aspect, the invention provides a polymer in the form of a novolac resin comprising recurring units of the following structural formula (1):

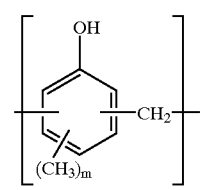

(1)

wherein m is an integer of 0 to 3, and having a weight average molecular weight calculated as polystyrene of 1,000 to 30,000. Some of the hydrogen atoms of the hydroxyl groups on the novolac resin are replaced by 1,2-naphthoquinonediazidosulfonyl ester groups and some of the hydrogen atoms of the remaining hydroxyl groups are replaced by substituents of at least one type selected from functional groups of the following general formulae (2), (3), and (4).

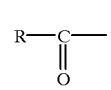

(2)

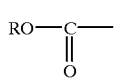

(3)

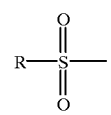

(4)

R is a straight, branched or cyclic alkyl group of 1 to 30 carbon atoms, aryl group of 6 to 20 carbon atoms or aralkyl group of 7 to 20 carbon atoms.

Preferably, the hydrogen atoms of the hydroxyl groups in the novolac resin are replaced by 1,2-naphthoquinonediazidosulfonyl ester groups in a proportion of 0.03 to 0.3 mol per hydrogen atom, and the hydrogen atoms of the remaining hydroxyl groups are replaced by functional groups of formula (2), (3) or (4) in a proportion of 0.01 to 0.8 mol per hydrogen atom.

In a second aspect, the invention provides a resist composition comprising the above-defined polymer.

In a third aspect, the invention provides a method for forming a resist pattern comprising the steps of (i) applying the resist composition onto a substrate, (ii) heat treating the coated film and then exposing it to high-energy radiation having a wavelength of up to 500 nm or electron beams through a photo mask, and (iii) optionally heat treating the exposed film and developing it with a developer.

DESCRIPTION OF THE PREFERRED EMBODIMENTS

The novel polymer or high molecular weight compound of the invention is in the form of a novolac resin comprising recurring units of the following structural formula (1):

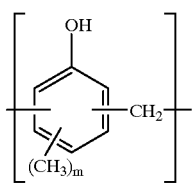
(1)

wherein m is an integer of 0 to 3. Some of the hydrogen atoms of the hydroxyl groups in the novolac resin are replaced by 1,2-naphthoquinonediazidosulfonyl ester groups and some of the hydrogen atoms of the remaining hydroxyl groups are replaced by substituents of at least one type selected from functional groups of the following general formulae (2), (3), and (4).

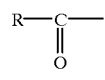
(2)

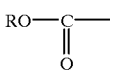
(3)

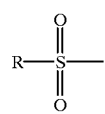
(4)

R is a straight, branched or cyclic alkyl group of 1 to 30 carbon atoms, preferably 1 to 10 carbon atoms, more preferably 1 to 5 carbon atoms, an aryl group of 6 to 20 carbon atoms, preferably 6 to 12 carbon atoms, more preferably 6 to 8 carbon atoms, or an aralkyl group of 7 to 20 carbon atoms, preferably 7 to 13 carbon atoms, more preferably 7 to 9 carbon atoms. The polymer has a weight average molecular weight calculated as polystyrene of 1,000 to 30,000.

The letter m is an integer of 0 to 3, preferably equal to 1 or 2.

Of the groups represented by R, examples of the straight, branched or cyclic alkyl group of 1 to 30 carbon atoms include methyl, ethyl, propyl, isoproyl, n-butyl, isobutyl, tert-butyl, n-pentyl, tert-butylmethyl, n-hexyl, n-heptyl, n-octyl, n-decyl, n-dodecyl, n-hexyl, palmityl, n-stearyl, cyclopropyl, cyclopentyl, cyclohexyl and cholesteryl. Examples of the aryl group of 6 to 20 carbon atoms include phenyl, tolyl, ethylphenyl, propylphenyl, dimethylphenyl, methylethylphenyl, naphthyl, furyl and biphenyl. Examples of the aralkyl group of 7 to 20 carbon atoms include benzyl, methylbenzyl, propylbenzyl, and dimethylbenzyl.

In the polymer of the invention, the percent substitution of 1,2-naphthoquinonediazidosulfonyl ester group is preferably 0.03 to 0.3 mol, more preferably 0.05 to 0.2 mol per hydrogen atom of the hydroxyl group in the novolac resin. If the percent substitution of 1,2-naphthoquinonediazidosulfonyl ester group is less than 0.03 mol per hydrogen atom, the retention of a polymer film would be exacerbated, suggesting that a resist composition fails to form a pattern and becomes useless. If the percent substitution of 1,2-naphthoquinonediazidosulfonyl ester group is more than 0.3 mol, the polymer would become difficultly soluble in solvents and thus difficult to formulate a resist composition.

The percent substitution of substituted carbonyl or sulfonyl group of formula (2), (3) or (4) is preferably 0.01 to 0.8 mol, more preferably 0.02 to 0.6 mol per hydrogen atom of the hydroxyl group in the novolac resin. If the percent substitution of substituted carbonyl or sulfonyl group is less than 0.01 mol per hydrogen atom, the resulting resist would be low in resolution and adhesion to the substrate. If the percent substitution of substituted carbonyl or sulfonyl group is more than 0.8 mol, exposed areas of the resist would become difficult to be dissolved in a developer, prohibiting pattern formation.

The polymer should have a weight average molecular weight calculated as polystyrene of 1,000 to 30,000, and preferably 3,000 to 20,000. With a weight average molecular weight of less than 1,000, the retention of a polymer film after development and the heat resistance thereof would be poor. With a weight average molecular weight of more than 30,000, the resist would have poor resolution and sensitivity.

The polymer may be prepared by subjecting a novolac resin of formula (1), 1,2-naphthoquinonediazidosulfonyl chloride, and a substituted carbonyl or sulfonyl halide of the following general formula (5), (6) or (7) to dehydrochlorination reaction.

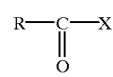
(5)

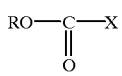
(6)

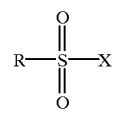
(7)

R is a straight, branched or cyclic alkyl group of 1 to 30 carbon atoms, an aryl group of 6 to 20 carbon atoms, or an aralkyl group of 7 to 20 carbon atoms, and X is a halogen atom such as chlorine, bromine and iodine.

As the novolac resin of formula (1), there may be used any of novolac resins having a weight average molecular weight of 1,000 to 30,000 which are obtained by polycondensing a phenol such as p-cresol or m-cresol with an aldehyde such as formaldehyde in the presence of a polycondensation catalyst such as oxalic acid.

Reaction conditions may be selected as appropriate when the novolac resin is reacted with 1,2-naphthoquinonediazidosulfonyl chloride and a substituted carbonyl or sulfonyl chloride. Preferably reaction is carried out in a solvent at a temperature of 5 to 50° C. for about 1 to 5 hours. Exemplary suitable solvents are 1,4-dioxane, tetrahydrofuran, N,N-dimethylformamide, N,N-dimethylacetamide, acetone, methyl ethyl ketone, and methyl isobutyl ketone.

The polymer of the invention is useful as a base resin of a resist composition. The invention therefore provides a resist composition comprising the polymer dissolved as a base resin in a solvent.

There may be used any of solvents in which the polymer and other resist components have a sufficient solubility and which ensures a film forming ability. Exemplary solvents are cellosolve solvents such as methyl cellosolve, ethyl cellosolve, methyl cellosolve acetate, and ethyl cellosolve acetate; propylene glycol solvents such as propylene glycol monomethyl ether, propylene glycol monobutyl ether, propylene glycol monomethyl ether acetate, propylene glycol dimethyl ether, and propylene glycol monoethyl ether acetate; ester solvents such as butyl acetate, amyl acetate, methyl lactate, ethyl lactate, 3-methoxypropionic acid, ethyl 3-ethoxy-propionate; alcohol solvents such as hexanol and diacetone alcohol; ketone solvents such as cyclohexanone and methyl amyl ketone; ether solvents such as methyl phenyl ether and diethylene glycol dimethyl ether; highly polar solvents such as N,N-dimethylformamide and N-methyl-pyrrolidone; and mixtures thereof. An appropriate amount of the solvent used is desirably 1 to 20 times, especially 1 to 15 times the total weight of solids (or novolac resin of the invention).

To the resist composition, small amounts of additives such as dyestuffs, pigments and surfactants may be added if desired.

Pattern formation using the resist composition of the invention may be carried out by a known lithographic technique. For example, the resist composition is applied onto a substrate such as a silicon wafer by spin coating or the like to form a resist film having a thickness of 0.5 to 2.0 $\mu$m, which is then pre-baked on a hot plate at 60 to 150° C. for 1 to 10 minutes, and preferably at 80 to 120° C. for 1 to 5 minutes. A patterning mask having the desired pattern is then placed over the resist film, and the film exposed through the mask to an electron beam or to high-energy radiation having a wavelength of 500 nm or less in a dose of about 1 to 200 mJ/cm$^2$, and preferably about 10 to 100 mJ/cm$^2$, and optionally, post-exposure baked (PEB) on a hot plate at 60 to 150° C. for 1 to 5 minutes, and preferably at 80 to 120° C. for 1 to 3 minutes. Finally, development is carried out using as the developer an aqueous alkali solution, such as a 0.1 to 5% (preferably 2 to 3%) aqueous solution of tetramethyl-ammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with radiation having a wavelength of 300 to 500 nm. The desired pattern may not be obtainable outside the upper and lower limits of the above range.

It is noted that the resist composition of the invention is advantageously used as a positive working resist composition.

There has been described a novel polymer in the form of a novolac resin in which some of the hydrogen atoms of hydroxyl groups are replaced by 1,2-naphthoquinonediazidosulfonyl ester groups and substituted carbonyl or sulfonyl groups. The polymer is effective as a base resin in a resist composition. The resist composition comprising the polymer has improved uniformity, sensitivity, resolution and pattern geometry in microfabrication as well as improved heat resistance, film retention, substrate adhesion and storage stability.

EXAMPLE

Examples of the invention are given below by way of illustration and not by way of limitation.

Synthetic Example 1
Synthesis of Novolac Resin

A three-necked flask equipped with a stirrer, condenser, and thermometer was charged with 64.9 g (0.6 mol) of p-cresol, 43.3 g (0.4 mol) of m-cresol, 48.7 g (0.52 mol) of a 37 wt % formaldehyde aqueous solution, and 0.30 g (2.40×10$^{-3}$ mol) of oxalic acid dehydrate as a polycondensation catalyst. While the flask was placed in an oil bath to keep the internal temperature at 100° C., polycondensation was effected for one hour. After the completion of reaction, 500 ml of methyl isobutyl ketone (MIBK) was added to the reaction solution, which was stirred for 30 minutes. With the aqueous layer separated, the product extracted in the MIBK layer was washed 5 times with 300 ml of pure water. After separation, the product was vacuum stripped at 4 mmHg and 150° C. by means of an evaporator, yielding 87 g of novolac resin A.

Synthetic Examples 2–5
Synthesis of Novolac Resins

Novolac resins B, C, D, and E were synthesized as in Synthetic Example 1. The molar ratio of m-cresol/p-cresol and the molar ratio of formaldehyde/cresol (F/C) are reported in Table 1 together with the weight average molecular weight (Mw) of novolac resins A to E.

TABLE 1

| Synthetic Example | Novolac resin | m-/p-cresol (molar ratio) | F/C (molar ratio) | Mw |
| --- | --- | --- | --- | --- |
| 1 | A | 40/60 | 0.52 | 3,000 |
| 2 | B | 30/70 | 0.59 | 6,200 |
| 3 | C | 80/20 | 0.85 | 25,000 |
| 4 | D | 50/50 | 0.81 | 40,000 |
| 5 | E | 50/50 | 0.48 | 800 |

It is noted that for the measurement of Mw, a GPC column system (two G-2000H6 tubes, one G-3000H6 tube, and one G-4000H6 tube) by Tosoh K.K. was used. Measurement was made with eluting solvent THF at a flow rate of 1.5 ml/min and a column temperature of 40° C.

Synthetic Example 6
Synthesis of Novolac Resin Having 1,2-Naphthoquinonediazidosulfonyl Ester Groups and Phenylacetyl Groups Substituted Thereon Under light-shielded conditions, a three-necked flask equipped with a stirrer, dropping funnel, condenser, and thermometer was charged with 120 g (1 mol) of novolac resin A obtained in Synthetic Example 1, 13.4 g (0.05 mol) of 1,2-naphthoquinonediazidosulfonyl chloride, 46.4 g (0.3 mol) of phenylacetyl chloride, and 400 g of acetone, which were dissolved by one hour of stirring. After the flask was placed in a water bath adjusted at 25° C., 37.2 g (0.37 mol) of triethylamine was added dropwise such that the internal temperature might not exceed 30° C. After one hour of ripening, the reaction solution was poured into 5,000 ml of 0.1N hydrochloric acid. The resulting precipitate was collected by filtration, dissolved in 800 g of methyl isobutyl ketone, washed with water, and separated. Vacuum stripping at 40° C. yielded 167 g of novolac resin A-1 in which the hydrogen atoms of hydroxyl groups on novolac resin A were partially replaced by 1,2-naphthoquinoneiazidosulfonyl ester groups (substitution 5%) and phenylacetyl groups (substitution 30%).

Synthetic Example 7
Synthesis of Novolac Resin Having 1,2-Naphthoquinonediazidosulfonyl Ester Groups and Valeryl Groups Substituted Thereon Under light-shielded conditions, a three-necked flask equipped with a stirrer, dropping funnel, condenser, and thermometer was charged with 120 g (1 mol) of novolac resin B obtained in Synthetic Example 2, 40.3 g (0.15 mol) of 1,2-naphthoquinonediazidosulfonyl chloride, 18.1 g (0.15 mol) of valeryl chloride, and 400 g of acetone, which were dissolved by one hour of stirring. After the flask was placed in a water bath adjusted at 25° C., 31.9 g (0.32 mol) of triethylamine was added dropwise such that the internal temperature might not exceed 30° C. After one hour of ripening, the reaction solution was poured into 5,000 ml of 0.1N hydrochloric acid. The resulting precipitate was collected by filtration, dissolved in 800 g of methyl isobutyl ketone, washed with water, and separated. Vacuum stripping at 40° C. yielded 167 g of novolac resin B-1 in which the hydrogen atoms of hydroxyl groups on novolac resin B were partially replaced by 1,2-naphthoquinonediazidosulfonyl ester groups (substitution 15%) and valeryl groups (substitution 15%).

Synthetic Example 8
Synthesis of Novolac Resin Having 1,2-Naphthoquinonediazidosulfonyl Ester Groups and Acetyl Groups Substituted Thereon Under light-shielded conditions, a three-necked flask equipped with a stirrer, dropping funnel, condenser, and thermometer was charged with 120 g (1 mol) of novolac resin C obtained in Synthetic Example 3, 67.2 g (0.25 mol) of 1,2-naphthoquinonediazidosulfonyl chloride, 3.9 g (0.05 mol) of acetyl chloride, and 400 g of acetone, which were dissolved by one hour of stirring. After the flask was placed in a water bath adjusted at 25° C., 31.9 g (0.32 mol) of triethylamine was added dropwise such that the internal temperature might not exceed 30° C. After one hour of ripening, the reaction solution was poured into 5,000 ml of 0.1N hydrochloric acid. The resulting precipitate was collected by filtration, dissolved in 800 g of methyl isobutyl ketone, washed with water, and separated. Vacuum stripping at 40° C. yielded 180 g of novolac resin C-1 in which the hydrogen atoms of hydroxyl groups on novolac resin C were partially replaced by 1,2-naphthoquinonediazidosulfonyl ester groups (substitution 25%) and acetyl groups (substitution 5%).

Synthetic Example 9
Synthesis of Novolac Resin Having 1,2-Naphthoquinonediazidosulfonyl Ester Groups and Benzoyl Groups Substituted Thereon Under light-shielded conditions, a three-necked flask equipped with a stirrer, dropping funnel, condenser, and thermometer was charged with 120 g (1 mol) of novolac resin B obtained in Synthetic Example 2, 21.5 g (0.08 mol) of 1,2-naphthoquinonediazidosulfonyl chloride, 7.0 g (0.05 mol) of benzoyl chloride, and 400 g of acetone, which were dissolved by one hour of stirring. After the flask was placed in a water bath adjusted at 25° C., 13.8 g (0.14 mol) of triethylamine was added dropwise such that the internal temperature might not exceed 30° C. After one hour of ripening, the reaction solution was poured into 5,000 ml of 0.1N hydrochloric acid. The resulting precipitate was collected by filtration, dissolved in 800 g of methyl isobutyl ketone, washed with water, and separated. Vacuum stripping at 40° C. yielded 143 g of novolac resin B-2 in which the hydrogen atoms of hydroxyl groups on novolac resin B were partially replaced by 1,2-naphthoquinoneiazidosulfonyl ester groups (substitution 8%) and benzoyl groups (substitution 5%).

Synthetic Example 10
Synthesis of Novolac Resin Having 1,2-Naphthoquinonediazidosulfonyl Ester Groups and P-toluenesulfonyl Groups Substituted Thereon Under light-shielded conditions, a three-necked flask equipped with a stirrer, dropping funnel, condenser, and thermometer was charged with 120 g (1 mol) of novolac resin A obtained in Synthetic Example 1, 26.9 g (0.10 mol) of 1,2-naphthoquinonediazidosulfonyl chloride, 19.1 g (0.10 mol) of p-toluenesulfonyl chloride, and 400 g of acetone, which were dissolved by one hour of stirring. After the flask was placed in a water bath adjusted at 25° C., 21.2 g (0.21 mol) of triethylamine was added dropwise such that the internal temperature might not exceed 30° C. After one hour of ripening, the reaction solution was poured into 5,000 ml of 0.1N hydrochloric acid. The resulting precipitate was collected by filtration, dissolved in 800 g of methyl isobutyl ketone, washed with water, and separated. Vacuum stripping at 40° C. yielded 158 g of novolac resin A-2 in which the hydrogen atoms of hydroxyl groups on novolac resin A were partially replaced by 1,2-naphthoquinonediazidosulfonyl ester groups (substitution 10%) and p-toluenesulfonyl groups (substitution 10%).

Synthetic Example 11 (Comparative Example 1)
Synthesis of Novolac Resin Having 1,2-Naphthoquinonediazidosulfonyl Ester Groups and Acetyl Groups Substituted Thereon Under light-shielded conditions, a three-necked flask equipped with a stirrer, dropping funnel, condenser, and thermometer was charged with 120 g (1 mol) of novolac resin D obtained in Synthetic Example 4, 26.9 g (0.1 mol) of 1,2-naphthoquinonediazidosulfonyl chloride, 1.6 g (0.02 mol) of acetyl chloride, and 400 g of acetone, which were dissolved by one hour of stirring. After the flask was placed in a water bath adjusted at 25° C., 12.7 g (0.13 mol) of triethylamine was added dropwise such that the internal temperature might not exceed 30° C. After one hour of ripening, the reaction solution was poured into 5,000 ml of 0.1N hydrochloric acid. The resulting precipitate was collected by filtration, dissolved in 800 g of methyl isobutyl ketone, washed with water, and separated. Vacuum stripping at 40° C. yielded 144 g of novolac resin D-1 in which the hydrogen atoms of hydroxyl groups on novolac resin D were partially replaced by 1,2-naphthoquinonediazidosulfonyl ester groups (substitution 10%) and acetyl groups (substitution 2%).

Synthetic Example 12 (Comparative Example 2)
Synthesis of Novolac Resin Having 1,2-Naphthoquinonediazidosulfonyl Ester Groups and Phenylacetyl Group Substituted Thereon Under light-shielded conditions, a three-necked flask equipped with a stirrer, dropping funnel, condenser, and thermometer was charged with 120 g (1 mol) of novolac resin E obtained in Synthetic Example 5, 53.7 g (0.2 mol) of 1,2-naphthoquinonediazidosulfonyl chloride, 92.8 g (0.6 mol) of phenylacetyl chloride, and 400 g of acetone, which were dissolved by one hour of stirring. After the flask was placed in a water bath adjusted at 25° C., 85.0 g (0.84 mol) of triethylamine was added dropwise such that the internal temperature might not exceed 30° C. After one hour of ripening, the reaction solution was poured into 5,000 ml of 0.1N hydrochloric acid. The resulting precipitate was collected by filtration, dissolved in 800 g of methyl isobutyl ketone, washed with water, and separated. Vacuum stripping at 40° C. yielded 237 g of novolac resin E-1 in which the hydrogen atoms of hydroxyl groups on novolac resin E were partially replaced by 1,2-naphthoquinonediazidosulfonyl ester groups (substitution 20%) and phenylacetyl groups (substitution 60%).

Synthetic Example 13 (Comparative Example 3)
Synthesis of Novolac Resin Having Only 1,2-naphthoquinonediazidosulfonyl Ester Groups Substituted Thereon Under light-shielded conditions, a three-necked flask equipped with a stirrer, dropping funnel, condenser, and thermometer was charged with 120 g (1 mol) of novolac resin C obtained in Synthetic Example 3, 26.9 g (0.1 mol) of 1,2-naphthoquinonediazidosulfonyl chloride, and 400 g of acetone, which were dissolved by one hour of stirring. After the flask was placed in a water bath adjusted at 25° C., 10.6 g (0.11 mol) of triethylamine was added dropwise such that the internal temperature might not exceed 30° C. After one hour of ripening, the reaction solution was poured into 5,000 ml of 0.1N hydrochloric acid. The resulting precipitate was collected by filtration, dissolved in 800 g of methyl isobutyl ketone, washed with water, and separated. Vacuum stripping at 40° C. yielded 143 g of novolac resin C-2 in which the hydrogen atoms of hydroxyl groups on novolac resin C were partially replaced by 1,2-naphthoquinonediazidosulfonyl ester groups (substitution 10%).

Table 2 summarizes the data of the novolac resins having 1,2-naphthoquinonediazidosulfonyl ester groups (NQD) and substituted carbonyl or sulfonyl groups (SC) substituted thereon in Synthesis Examples 6 to 13.

TABLE 2

| Synthesis Example | Novolac resin product | Starting novolac resin | NQD substitution (mol %) | SC substitution (mol %) |
|---|---|---|---|---|
| 6 | A-1 | A | 5 | 30 |
| 7 | B-1 | B | 15 | 15 |
| 8 | C-1 | C | 25 | 5 |
| 9 | B-2 | B | 8 | 5 |
| 10 | A-2 | A | 10 | 10 |
| 11 | D-1 | D | 10 | 2 |
| 12 | E-1 | E | 20 | 60 |
| 13 | C-2 | C | 10 | 0 |

Example 1

In 100 g of propylene glycol monomethyl ether acetate, 50 g of novolac resin A-1 was dissolved together with 0.125 g of a surfactant FC-430 (trade name, Sumitomo 3M). The solution was passed through a membrane filter with a pore size of 0.2 μm, obtaining a resist solution.

The resist solution was applied onto a 6-inch bare silicon wafer by means of a spinner and pre-baked on a hot plate at 100° C. for 120 seconds to form a resist film of 3.0 μm thick. The resist film was exposed to light using an i-line stepper NSR-1755i7 (Nikon K.K., NA=0.5), followed by development and rinsing with pure water. The resulting pattern was examined. By observing a 10-μm line-and-space pattern under an SEM (Hitachi K.K.), it was examined whether or not side walls of the pattern were perpendicular to the substrate. The resolution was determined by examining whether resist scum was present or absent in spaces. Further, the adhesion of the resist film to the substrate was examined by observing a 1.5-μm line-and-space pattern to find a flow in the pattern.

Examples 2–5 & Comparative Examples 1–3

As in Example 1, the novolac resins of Synthetic Examples 6 to 13 were examined for the perpendicularity of pattern sidewalls, resolution in terms of the presence or absence of resist scum in spaces, and the adhesion of the resist film to the substrate in terms of a pattern flow upon observation of a 1.5-μm line-and-space pattern.

The results are shown in Table 3.

TABLE 3

| | Novolac resin product | Pattern sidewall perpendicularity and resolution | Adhesion to substrate |
|---|---|---|---|
| E1 | A-1 | perpendicular, no scum | no pattern flow |
| E2 | B-1 | perpendicular, no scum | no pattern flow |
| E3 | C-1 | perpendicular, no scum | no pattern flow |
| E4 | B-2 | perpendicular, no scum | no pattern flow |
| E5 | A-2 | perpendicular, no scum | no pattern flow |
| CE1 | D-1 | positive taper, scum | no pattern flow |
| CE2 | E-1 | noticeable film thinning | pattern flow |
| CE3 | C-2 | perpendicular, no scum | partial pattern flow |

Japanese Patent Application No. 10-241129 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer in the form of a novolac resin comprising recurring units of the following structural formula (1):

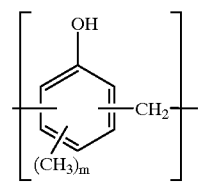

(1)

wherein m is an integer of 0 to 3, and having a weight average molecular weight calculated as polystyrene of 1,000 to 30,000, wherein some of the hydrogen atoms of the hydroxyl groups are replaced by 1,2-naphthoquinonediazido-sulfonyl ester groups and some of the hydrogen atoms of the remaining hydroxyl groups are replaced by substituents of at least one type selected from functional groups of the following formulae (2), (3), and (4):

(2)

(3)

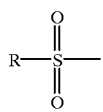

(4)

wherein R is a straight, branched or cyclic alkyl group of 1 to 30 carbon atoms, aryl group of 6 to 20 carbon atoms or aralkyl group of 7 to 20 carbon atoms with proviso that naphthyl groups are excluded from the definition of R in formula (4).

2. The polymer of claim 1 wherein the hydrogen atoms of the hydroxyl groups in the novolac resin are replaced by 1,2-naphthoquinonediazidosulfonyl ester groups in a proportion of 0.03 to 0.3 mol per hydrogen atom, and the hydrogen atoms of the remaining hydroxyl groups are replaced by substituents of at least one type selected from functional groups of formulae (2), (3), and (4) in a proportion of 0.01 to 0.8 mol per hydrogen atom.

3. A resist composition comprising the polymer of claim 1.

4. A method for forming a resist pattern comprising the steps of:
(i) applying a resist composition according to claim 3 onto a substrate,
(ii) heat treating the coated film and then exposing it to high-energy radiation having a wavelength of up to 500 nm or electron beams through a photo mask, and
(iii) optionally heat treating the exposed film and developing it with a developer.

5. The polymer of claim 1, wherein the polymer has an average molecular weight, calculated as polystyrene, of 1,000 to 30,000.

6. The polymer of claim 1, wherein the polymer has an average molecular weight, calculated as polystyrene, of 3,000 to 20,000.

7. The polymer of claim 1, wherein in formula (1), m is 1 or 2.

8. The polymer of claim 1, wherein hydrogen atoms of the hydroxyl groups in the novalac resin are replaced by 1,2-naphthoquinonediazidosulfonyl ester groups in a proportion of 0.05 to 0.2 mol per hydrogen atom of the hydroxyl groups in the resin, and the hydrogen atoms of the remaining hydroxyl groups in the novalac resin are replaced by substituents of at least one type selected from functional groups of the formulae (2), (3) and (4) in a proportion of 0.02 to 0.6 mol per hydrogen atom of the hydroxyl groups in the resin.

9. The resist composition of claim 3, wherein the resist composition is a positive working resist composition.

* * * * *